(12) United States Patent
Gronbach

(10) Patent No.: US 7,200,159 B2
(45) Date of Patent: Apr. 3, 2007

(54) METHOD AND APPARATUS FOR TEMPERATURE STABILIZATION OF A WAVELENGTH OF A LASER

(75) Inventor: Siegfried Gronbach, Bubenreuth (DE)

(73) Assignee: Lucent Technologies Inc., Murray Hill, NJ (US)

( * ) Notice: Subject to any disclaimer, the term of this patent is extended or adjusted under 35 U.S.C. 154(b) by 256 days.

(21) Appl. No.: 10/790,621

(22) Filed: Mar. 1, 2004

(65) Prior Publication Data

US 2005/0190803 A1 Sep. 1, 2005

(51) Int. Cl.
*H01S 3/13* (2006.01)
(52) U.S. Cl. ................... 372/29.02; 372/33
(58) Field of Classification Search ............. 372/34, 372/33, 36, 107
See application file for complete search history.

(56) References Cited

U.S. PATENT DOCUMENTS

| 5,144,632 | A  | * | 9/1992  | Thonn .................. 372/33    |
| 6,560,255 | B1 | * | 5/2003  | O'Brien et al. ............ 372/34 |
| 6,671,296 | B2 | * | 12/2003 | May ..................... 372/20   |
| 2003/0108353 | A1 | * | 6/2003 | Nasu et al. ............. 398/91   |

FOREIGN PATENT DOCUMENTS

EP   05 25 0875   4/2005

* cited by examiner

*Primary Examiner*—Minsun Oh Harvey
*Assistant Examiner*—Tuan N. Nguyen

(57) ABSTRACT

A method and apparatus for temperature stabilization of a wavelength of a laser compensate for thermal instability of a internal etalon of the wavelength using the results of measuring the wavelength with an external wavelength meter.

16 Claims, 3 Drawing Sheets

METHOD AND APPARATUS FOR TEMPERATURE STABILIZATION OF A WAVELENGTH OF A LASER

FIELD OF THE INVENTION

The present invention generally relates to the field of high-speed optical communications and, more specifically, to dense wavelength division multiplexing (DWDM) systems.

BACKGROUND OF THE INVENTION

In high-speed optical communications, a method of wavelength division multiplexing (DWDM) is used to increase transmission capacity of an optical fiber. A DWMD system comprises a plurality of transmission lasers, which operate at different wavelengths and are coupled to the same single-mode fiber. A wavelength of a laser should be stabilized within a narrow range corresponding to an optical transmission channel of the system.

The wavelength of the laser strongly depends on a temperature of a laser chip. The laser generally includes an internal wavelength locker measuring the wavelength of the laser and a temperature control circuit to compensate for temperature instability of the laser chip. Both the laser chip and the internal wavelength locker are typically disposed on a temperature-controlled submount maintained at a stabilized temperature independent from the environmental conditions.

However, in operation, there may be a need to modify a bias current of the laser chip to compensate for changes in the optical output power when, for example, the laser degrades over time. In this case, the wavelength locker's temperature also changes and the wavelength locker measures a wavelength of the laser with an error that may cause a cross-channel interference and, as such, limit the performance of the DWDM system.

Therefore, there is a need in the art for an improved method and apparatus for temperature stabilization of a wavelength of a laser used in a DWDM system.

SUMMARY OF THE INVENTION

The present invention is generally a method and apparatus for temperature stabilization of a wavelength of a laser (e.g., laser used in a DWDM system) that, in operation, compensate for thermal instability of an internal etalon of the wavelength.

In one embodiment of the present invention, the method of temperature stabilization of a wavelength of a laser comprises measuring a representative temperature of the laser (i.e., temperature of a laser chip), measuring the wavelength of the laser using an internal etalon of the wavelength, defining a correction factor for the etalon using an external meter of the wavelength, and operating a module defining the representative temperature at a set point corresponding to a generation of an optical power at a wavelength equal to a sum of the wavelength measured using the internal etalon and the correction factor.

Another aspect of the invention is an apparatus facilitating the method of temperature stabilization of the wavelength of a laser.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION OF THE INVENTION

The present invention advantageously provides stabilization of a wavelength of a laser (e.g., semiconductor diode laser in a dense wavelength division multiplexing (DWDM) system) by compensating for thermal instability of a laser chip and an internal wavelength locker (i.e., etalon) utilizing the results of measuring the wavelength of the laser using an external wavelength meter.

Figure 1:
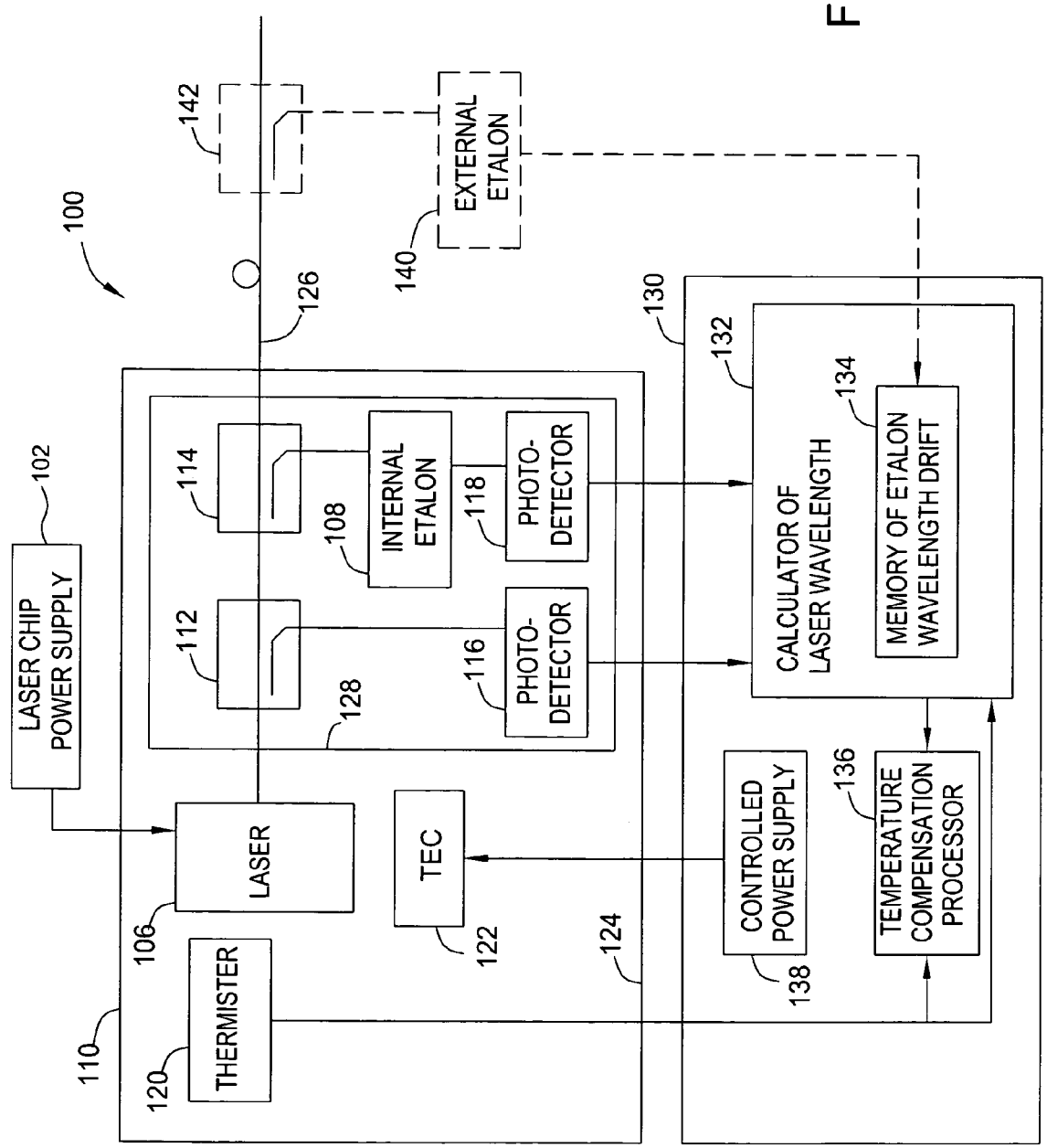
FIG. 1 depicts an exemplary block diagram of a laser which wavelength is temperature stabilized in accordance with one embodiment of the present invention.

FIG. 1 depicts an exemplary block diagram of a laser 100 which wavelength may be temperature stabilized in accordance with one embodiment of the present invention. The laser 100 comprises an integrated laser chip assembly 110, a laser chip power supply 102, and a temperature controller 130. The laser chip assembly 110 generally includes a laser chip 106, a wavelength locker 128, a thermoelectric module (TEC) 122, and a temperature sensor 120, which are disposed in a sealed enclosure 124. In one embodiment, the wavelength locker 128 comprises broadband optical couplers 112 and 114, an internal wavelength etalon 108, and photodetectors 116 and 118.

The laser chip 106 and wavelength locker 128 are generally disposed on a temperature-controlled submount (not shown). The temperature of the laser chip 106 and wavelength locker 128 is controlled using the TEC 122. The TEC 122 may be conventionally bonded to or thermally coupled to the submount using, e.g., a thermoconductive medium. In operation, the TEC 122 controls the temperature of the laser chip 106, thereby compensating the temperature-related instabilities of a wavelength of the laser 100.

The temperature sensor 120 (e.g., thermistor or thermocouple) monitors a representative temperature $T_R$. In operation, a temperature control loop of the laser 100 maintains the temperature $T_R$ at a level determined using the temperature controller 130. In general, the temperature $T_R$ is equal or proportional to the temperature of the laser chip 106 and may include a temperature of the laser chip, a temperature of the etalon 108, a temperature of the submount, a temperature of the TEC 122, a temperature of the thermoconductive medium, and the like.

The temperature controller 130 comprises a laser wavelength calculator 132 having a memory 134 of a thermal drift of a wavelength of the etalon 108, a temperature compensation processor 136, and a controlled power supply 138. The controller 130 monitors an output signal of the sensor 120 (i.e., representative temperature $T_R$) and output signals from the photodetectors 116 and 118 of the wavelength locker 128 to define a set point for the controlled power supply 138.

In operation, the TEC 122, wavelength locker 128, and temperature controller 130 form a control loop that forces the wavelength of the laser chip 106 to follow a calibration wavelength of the etalon 108. Another control loop comprising the sensor 120, temperature controller 130, and TEC 122 determines the temperature of the laser chip 106.

In the DWDM system, a wavelength $\lambda_L$ of a laser should be always stabilized within a pre-determined range $\Delta\lambda$ that is allocated for an optical transmission channel of the system. A wavelength of the laser strongly depends on a temperature of a laser chip. Such a temperature is a complex function of a bias current and optical output power of the laser chip, ambient temperature, thermal properties of an enclosure of the laser, and other variables. The internal wavelength etalon (i.e., etalon 108) is generally calibrated to a central wavelength $\lambda_0$ of the range $\Delta\lambda$ and provides a feedback for compensating for such variables. However, thermal instability of the etalon results in a thermal drift of the wavelength of the laser chip. In particular, due to a difference in a thermal resistance between the laser chip and the etalon, as well as changes in the bias current, temperatures of the laser chip and etalon may be different and vary, thus causing the wavelength of the laser chip to drift beyond the range $\Delta\lambda$.

In the present invention, data related to a thermal drift of the calibration wavelength $\lambda_0$ of the internal etalon 108 as a function of the bias current (or temperature) of the laser chip 106 is collected using an external wavelength meter 140 (e.g., multi-wavelength meter mod. HP 86120C available from Hewlett-Packard, Polo Alto, Calif.). The meter 140 may be coupled to an output of the laser 100 using, e.g., a broadband optical coupler 142. In the depicted embodiment, the coupler 142 is coupled to a pigtail 126 of the laser 100. In a preferred embodiment, the meter 140 and coupler 142 are coupled to the laser 100 only during a test period that precedes an operation of the laser 100 in a DWDM system. In FIG. 1, a temporary nature of a connection between the laser 100 and the meter 140 is illustrated by using broken lines to depict the etalon, the coupler, and the corresponding interfaces.

Data related to dependence of the wavelength of the laser chip 106 and calibration wavelength $\lambda_0$ of the etalon 108 from the representative temperature may be provided by a manufacturer of the laser 100, stored in the calculator 132 (e.g., in erasable programmable read-only memory (EPROM) of the calculator), and, in operation, used to calculate a set point for the TEC 122. Alternatively, such data may be collected during the tests that define the drift of the wavelength $\lambda_0$ using the external wavelength meter 140.

Figure 2:
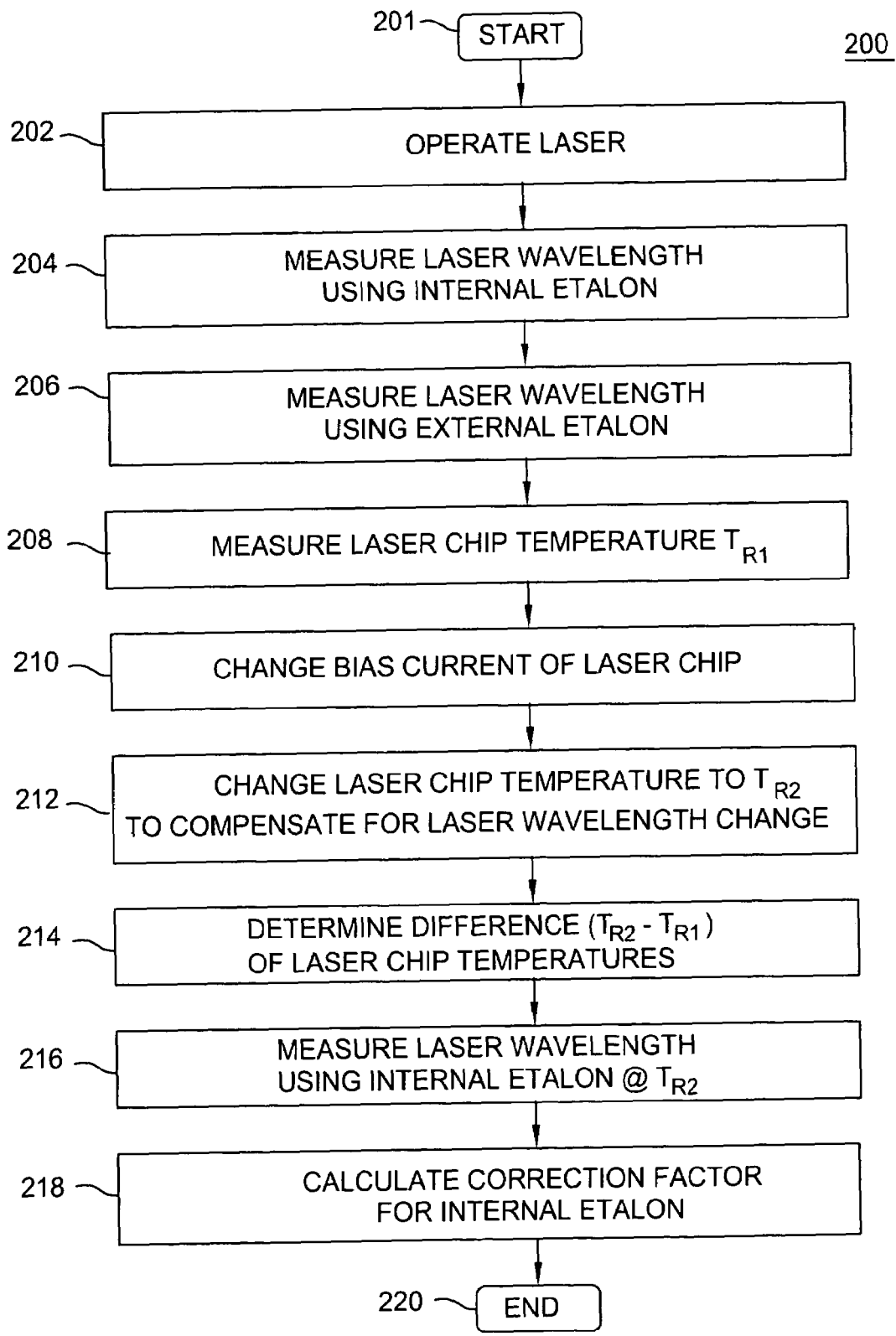
FIG. 2 depicts a flow diagram of a method of temperature stabilization of a wavelength of the laser of FIG. 1 in accordance with one embodiment of the present invention.

FIG. 2 depicts a flow diagram of one embodiment of the inventive method of temperature stabilization of the wavelength of the laser 100 as a process 200. The process 200 includes the processing steps that, in operation, facilitate temperature stabilization of the wavelength of the laser in an operational range of the laser chip temperatures and bias currents. To best understand the invention, the reader should simultaneously refer to FIGS. 1 and 2.

The process 200 starts at step 201 and proceeds to step 202, where operation (e.g., generation of an optical power) of the laser 100 begins.

At step 204, the wavelength $\lambda_L$ of the laser 100 is measured using the etalon 108 and determined using the laser wavelength calculator 132. In one exemplary embodiment, step 204 calculates the wavelength $\lambda_L$ using, as parameters, the calibration wavelength $\lambda_0$ and bandwidth of the etalon 108 and a ratio $\alpha$ (alpha) of the output currents $I_{IN}$ and $I_{OUT}$ of the photodetectors 116 and 118, $\alpha = I_{IN}/I_{OUT}$. The currents $I_{IN}$ and $I_{OUT}$ are proportional to a laser output power at an input and at the output of the etalon 108, respectively.

At step 206, the wavelength $\lambda_L$ of the laser 100 is measured using the external meter 140. The meter 140 generally has an accuracy that is equal to or exceeds the accuracy of the etalon 108, and the measurements of the wavelength $\lambda_L$ are performed in an operational range of the temperatures of the laser chip 106. The results of the measurements are stored in the memory 134 or, alternatively, may be processed using a remote processor (not shown). In a preferred embodiment, these measurements are performed prior to operating the laser 100 in the DWDM system.

At step 208, the representative temperature $T_{R1}$ of the laser assembly 110 (e.g., temperature of the laser chip 106) is measured using the sensor 120. The temperature $T_{R1}$ is communicated to the temperature compensation processor 136 and the laser wavelength calculator 132. Alternatively, step 206 may be performed before steps 204 and 206 or steps 204, 206, and 208 may be performed simultaneously.

At step 210, the bias current of the laser chip 106 is changed to a pre-determined value, thus causing a change in the temperature of the laser chip and, as such, in the wavelength of the laser 100.

At step 212, the representative temperature of the laser chip 106 is adjusted to $T_{R2}$ to compensate for the change of the wavelength of the laser 100. During step 212, the temperature of the laser chip 106 is measured using the sensor 120 and the wavelength of the laser is measured using the external meter 140. More specifically, the temperature of the laser chip 106 is adjusted until the chip generates at the same wavelength as during step 206.

At step 214, a difference (i.e., $\Delta T_R = T_{R2} - T_{R1}$) is defined in the temperature of the laser chip 106 needed for generating, during steps 206 and 212, at the same wavelength.

At step 216, the wavelength of the laser 100 is measured using the etalon 108 at the same temperature as at step 212 (i.e., $T_{R2}$).

At step 218, a correction factor for calculating the wavelength of the laser 100 using the etalon 108 is defined. In one embodiment, the correction factor is defined using a processor of the calculator 132 and then the stored in the memory 134. In an alternate embodiment (not shown), the correction factor may be defined using a remote processor. The correction factor may be expressed, for example, in the units of the $\Delta\alpha/\Delta T_R$. Upon defining the correction factor within an operational range of the bias currents of the laser chip 106, at step 220, the process 200 ends.

Figure 3:
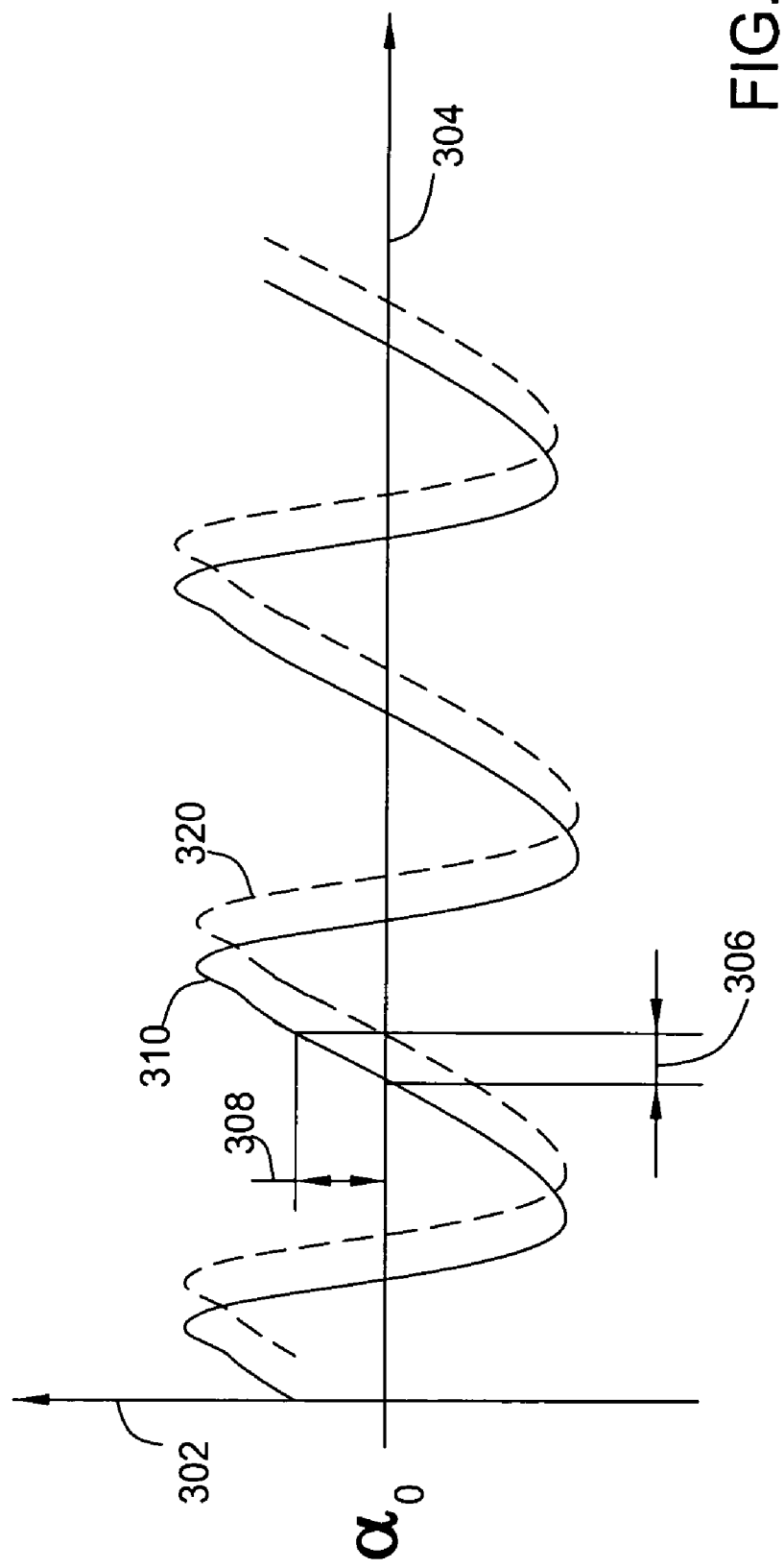
FIG. 3 depicts a series of exemplary diagrams illustrating the dependence of a calibration point of an internal etalon of the laser of FIG. 1 from temperature.

FIG. 3 depicts a series of exemplary diagrams illustrating the dependence of the calibration wavelength $\lambda_0$ of the etalon 108 from temperature. A first graph 310 depicts the ratio $\alpha$ (y-axis 302) as a function of a wavelength (x-axis 304) at a first temperature $T_1$. A second graph 320 depicts the ratio $\alpha$ as such a function at a second temperature $T_2$. In one embodiment, the temperatures $T_1$ and $T_2$ define an operational temperature range of the etalon 108. A parameter $\alpha_0$ corresponds to a value of the ratio $\alpha$ when the wavelength of the laser chip 106 is equal to the wavelength of the etalon 108, i.e., $\lambda_L = \lambda_0$. The second graph 320 is generally similar to the first graph 310, however, the graph 320 is shifted by an interval 306, with respect to the graph 310, along the x-axis 304. The interval 306 corresponds to a drift of the wavelength $\lambda_0$ of the etalon 108 in the temperature range from $T_1$ to $T_2$. The drift 306 may cause the laser chip 106 to generate at the wavelength corresponding to a value 308 of the ratio α.

In operation, the temperature compensation processor 136 and the controlled power supply 138 set the temperature of the TEC 122 such that the ratio α equals to a pre-determined value (e.g., $α_0$) corresponding to the desired wavelength $λ_0$. Unless corrected, the physical wavelength $λ_L$ of the laser chip will differ from the wavelength $λ_0$ due to the temperature dependency of the etalon 108. In FIG. 3, such temperature dependency of the etalon 108 is characterized by a value of the interval 306. The correction factor defined at step 216 (discussed in reference to process 200 in FIG. 2) compensates for the thermal dependency (i.e., drift) of the etalon 108. More specifically, the laser wavelength calculator 132 uses the correction factor to calculate the physical wavelength $λ_L$ and then communicates the results of the calculations to the temperature compensation processor 136. In this case, utilizing the correction factor, the processor 136 sets the temperature of the TEC 122 such that the physical wavelength $λ_L$ of the laser chip 106 equals to the desired wavelength $λ_0$.

In one exemplary application, using the inventive method 200, the temperature instability of the laser mod. JDS available from JDS Uniphase Corporation of San Jose, Calif. was reduced from 60 pm to less then 1 pm for laser bias currents varying in a range of about +/−20%.

While the foregoing is directed to the illustrative embodiment of the present invention, other and further embodiments of the invention may be devised without departing from the basic scope thereof, and the scope thereof is determined by the claims that follow.

What is claimed is:

1. A method of temperature stabilization of a wavelength of a laser, comprising:
    measuring a representative temperature of the laser;
    measuring the wavelength using an internal etalon of the wavelength; defining a correction factor for the etalon using an external meter of the wavelength; and
    operating a module defining the representative temperature at a set point corresponding to a generation of an optical power at a wavelength equal to a sum of the wavelength measured using the internal etalon and the correction factor;
    wherein the correction factor is defined using a method, comprising:
    (a) measuring the wavelength of the laser using the internal etalon;
    (b) measuring the wavelength of the laser using the external meter;
    (c) measuring the representative temperature;
    (d) modifying a bias current of a laser chip of the laser;
    (e) adjusting the representative temperature until the external meter measures the same wavelength as at the step (b);
    (f) defining a difference in the representative temperature at the steps (c) and (e); and
    (g) measuring the wavelength using the internal etalon.

2. The method of claim 1 wherein the wavelength of the laser k measured using the external meter prior to operating the laser in an optical transmission system.

3. The method of claim 1 wherein the correction factor is defined prior to operating the laser in an optical transmission system.

4. The method of claim 1 wherein the representative temperature is a temperature selected from the group consisting of a temperature of a laser chip of the laser, temperature of the internal etalon, a temperature of the module, a temperature of a submount housing the laser chip and the internal etalon, and a temperature of a medium between the laser Chip, the internal etalon, and the module.

5. The method of claim 1 wherein the module comprises a thermoelectric cooler/heater.

6. The method of claim 1 wherein the representative temperature is measured using a thermistor or a thermocouple.

7. The method of claim 1 wherein an accuracy of the external meter is equal or greater the accuracy of the internal etalon.

8. The method of claim 1 wherein the internal etalon measures the wavelength using a method, comprising:
    defining a ratio between a first electrical signal proportional to the output power at an input of the internal etalon and a second electrical signal proportional to the output power at an output of the internal etalon.

9. A method of temperature stabilization of a wavelength of a laser, comprising:
    measuring a representative temperature of the laser;
    measuring the wavelength using an internal etalon of the wavelength;
    defining a correction factor for the etalon using an external meter of the wavelength; and
    operating a module defining the representative temperature at a set point corresponding to a generation of an otical power at a wavelenqth equal to a sum of the wavelength measured using the internal etalon and the correction factor;
    wherein the laser comprises:
    a laser chip disposed on a submount;
    the internal etalon disposed on the submount;
    the module controlling a temperature of the faser chip and the internal etalon;
    a temperature sensor;
    a photodetector of an optical signal proportional to a laser output power at an input of the internal etalon; and
    a photodetector of an optical signal proportional to the laser output power at an output of the internal etalon.

10. The method of claim 9 wherein the wavelength of the laser is measured using the external meter prior to operating the laser in an optical transmission system.

11. The method of claim 9 wherein the correction factor is defined prior to operating the laser in an optical transmission system.

12. The method of claim 9 wherein the representative temperature is a temperature selected from the group consisting of a temperature of a laser chip of the laser, temperature of the internal etalon, a temperature of the module, a temperature of a submount housing the laser chip and the internal etalon, and a temperature of a medium between the laser chip, the internal etalon, and the module.

13. The method of claim 9 wherein the module comprises a thermoelectric cooler/heater.

14. The method of claim 9 wherein the representative temperature is measured using a thermistor or a thermocouple.

15. The method of claim 9 wherein an accuracy of the external meter is equal or greater the accuracy of the internal etalon.

16. The method of claim 9 wherein the internal etalon measures the wavelength using a method, comprising:
    defining of a ratio between a first electrical signal proportional to the output power at an input of the internal etalon and a second electrical signal proportional to the output power at an output of the internal etalon.

* * * * *